United States Patent [19]
Pedersen

[11] Patent Number: 6,072,332
[45] Date of Patent: Jun. 6, 2000

[54] VARIABLE DEPTH MEMORIES FOR PROGRAMMABLE LOGIC DEVICES

[75] Inventor: Bruce B. Pedersen, San Jose, Calif.

[73] Assignee: Altera Corporation, San Jose, Calif.

[21] Appl. No.: 09/023,251

[22] Filed: Feb. 13, 1998

Related U.S. Application Data
[60] Provisional application No. 60/062,963, Oct. 14, 1997.

[51] Int. Cl.[7] .............................................. H03K 19/177
[52] U.S. Cl. ................................................ 326/40; 326/41
[58] Field of Search .................................. 326/37–41, 47

[56] References Cited

U.S. PATENT DOCUMENTS

| | | |
|---|---|---|
| 4,642,487 | 2/1987 | Carter . |
| 4,670,749 | 6/1987 | Freeman ............................ 340/825.85 |
| 4,706,216 | 11/1987 | Carter ........................................ 365/94 |
| 4,758,985 | 7/1988 | Carter ........................................ 365/94 |
| 4,870,302 | 9/1989 | Freeman . |
| 5,089,993 | 2/1992 | Neal et al. ................................ 365/63 |
| 5,128,559 | 7/1992 | Steele . |
| 5,237,219 | 8/1993 | Cliff . |
| 5,258,668 | 11/1993 | Cliff et al. . |
| 5,260,610 | 11/1993 | Pedersen et al. . |
| 5,260,611 | 11/1993 | Cliff et al. . |
| 5,469,400 | 11/1995 | Yamano ............................. 365/230.01 |
| 5,550,782 | 8/1996 | Cliff et al. ........................ 365/230.03 |
| 5,689,195 | 11/1997 | Cliff et al. ................................. 326/41 |

FOREIGN PATENT DOCUMENTS

| | | | |
|---|---|---|---|
| 2 281 427 | 1/1995 | United Kingdom ......... | H03K 19/173 |

OTHER PUBLICATIONS

John L. Nichols, "A Logical Next Step for Read–Only Memories", Electronics, Jun. 12, 1967, pp. 111–113.

Floyd Kvamme, "Standard Read–Only Memories Simplfy Complex Logic Design", Electronics, Jan. 5, 1970, pp. 88–95.

Albert Hemel, "Making Small ROM's [sic] Do Math Quickly, Cheaply and Easily", Electronics, May 11, 1970, pp. 104–111.

William I. Fletcher et al., "Simplify Sequential Circuit Designs", Electronic Design, Jul. 8, 1971, pp. 70–72.

S.C. Hu, "Cellular Synthesis of Synchronous Sequential Machines", IEEE Transactions on Computers, Dec. 1972, pp. 1399–1405.

E.W. Page, "Programmable Array Realizations of Sequential Machines, "Department of Electrical Engineering, Duke University, Doctoral Dissertation, 1973.

Howard A. Sholl et al., "Design of Asynchronous Sequential Networks Using Read–Only Memories", IEEE Transactions on Computers, vol. C–24, No. 2, Feb. 1975, pp. 195–206.

Arnold Weinberger, "High–Speed Programmable Logic Array Adders", IBM J. Res. Develop., vol. 23, No. 2, Mar. 1979, pp. 163–178.

Yahiko Kambayashi, "Logic Design of Programmable Logic Arrays", IEEE Transactions on Computers, vol. C–28, No. 9, Sep. 1979, pp. 609–617.

"Optimized Reconfigurable Cell Array (ORCA) Series Field–Programmable Gate Arrays," Advanced Data Sheet, Feb. 1993, AT&T Microelectronics, pp. 1–87.

*The Programmable Logic Data Book,* Xilinx, Inc., 1994, pp. 2–5 through 2–102.

*Primary Examiner*—Michael Tokar
*Assistant Examiner*—Don Phu Le
*Attorney, Agent, or Firm*—Fish & Neave; Robert R. Jackson; Pejman Sharifi

[57] ABSTRACT

A programmable logic device, which includes a plurality of regions of memory usable by a user of the device, has circuitry for facilitating stringing or chaining together multiple memory regions to produce memory that is deeper than one region.

18 Claims, 6 Drawing Sheets

FIG. 4

| BIT 0 OF: | V0 | V1 | V2 | V3 | V4 | V5 | V6 | V7 | V8 | V9 | V10 | V11 | V12 |
|---|---|---|---|---|---|---|---|---|---|---|---|---|---|
| EAB0 | * | | | | | | | | | | | | |
| EAB1 | * | | * | * | * | | | | | | | | |
| EAB2 | * | | * | * | * | | | | | | | | |
| EAB3 | * | | * | * | | | | | | | | | |
| EAB4 | * | | * | * | | * | | | | | | | |
| EAB5 | * | | * | * | | * | | | | | | | |
| EAB6 | * | | * | * | | | * | | | | | | |
| EAB7 | * | | * | | | | * | | | | | | |
| EAB8 | * | | * | | | | * | | | | | | |
| EAB9 | * | | * | | | | | * | | | | | |
| EAB10 | * | | * | | | | | * | | | | | |
| EAB11 | * | | * | | | | | | * | | | | |
| EAB12 | * | * | | | | | | | * | * | | | |
| EAB13 | * | * | | | | | | | * | * | | | |
| EAB14 | * | * | | | | | | | * | * | | | |
| EAB15 | * | * | | | | | | | * | | | | |
| EAB16 | * | * | | | | | | | * | | | | |
| EAB17 | * | * | | | | | | | * | | * | | |
| EAB18 | * | * | | | | | | | * | | * | | |
| EAB19 | * | * | | | | | | | | | | | |
| EAB20 | * | * | | | | | | | | | | * | |
| EAB21 | * | * | | | | | | | | | | * | |
| EAB22 | * | * | | | | | | | | | | * | |
| EAB23 | * | * | | | | | | | | | | | |
| EAB24 | * | * | | | | | | | | | | | * |
| EAB25 | * | * | | | | | | | | | | | * |

VARIABLE DEPTH MEMORIES FOR PROGRAMMABLE LOGIC DEVICES

This application claims the benefit of United States provisional patent application Ser. No. 60/062,963, filed Oct. 14, 1997.

BACKGROUND OF THE INVENTION

This invention relates to programmable logic array integrated circuit devices, and more particularly to improved features for such devices (e.g., improved embedded array block (EAB) circuitry that allows EABs to be more easily combined to get deeper random access memory (RAM)).

Programmable logic array integrated circuit devices are well known, as shown, for example by Pedersen et al. U.S. Pat. No. 5,260,610, Cliff et al. U.S. Pat. No. 5,260,611, Cliff et al. U.S. Pat. No. 5,550,782, and Cliff et al. U.S. Pat. No. 5,689,195 (which are hereby incorporated by reference herein). Such devices often include a large number of regions of programmable logic disposed on the device in a two-dimensional array of intersecting "rows" and "columns" of such regions. Each region is programmable to perform any of several logic functions on signals applied to the region. Each row may have associated "horizontal" conductors for conveying signals to, from, and/or between the regions in the row. Each column may have associated "vertical" conductors for conveying signals to, from, and/or between the rows. Programmable connections may be provided for selectively connecting the conductors adjacent to each region to the inputs and outputs of the region, and also for selectively connecting various conductors to one another (e.g., connecting a horizontal conductor to a vertical conductor). Interconnection of regions through the above-mentioned conductors and programmable connections makes it possible for the programmable logic array device to perform much more complicated logic functions than can be performed by the individual regions.

In addition to the above-described interconnection of regions of programmable logic, programmable logic array integrated circuit devices sometimes include a number of regions of random access memory or RAM (herein referred to as embedded array blocks (EABs)) that are programmable and usable by the user to store and output any desired data. The '195 patent, for example, discusses the use and operation of RAM in a programmable logic array device.

Typically, EABs are fixed in size (e.g., 2K programmable bits) and can be configured as a 258×8, 512×4, 1042×2, or 2048×1 EAB. To get wider EABs with a depth up to 2K, multiple EABs may be combined in parallel (e.g., using eight 2048×1 EABs to make a 2048×8 EAB). In the prior art, however, to make EABs deeper than 2K required considerable external logic to perform address decoding and data multiplexing. This external logic may affect the timing of the EAB.

In view of the foregoing, it is an object of this invention to provide improved EABs for use in programmable logic array devices.

It is a more particular object of this invention to provide improved EABs which can be easily and efficiently combined to provide EABS with depths greater than 2K.

SUMMARY OF THE INVENTION

These and other objects of the invention are accomplished in accordance with the principles of the invention by providing in each EAB at least one and preferably two programmable decoders. One decoder (herein referred to as the "write decoder") is used to enable the writing of data into the EAB. Another decoder (herein referred to as the "read decoder") is used in connection with reading EAB data onto a tri-state bus. When EABs are not combined to form chains with depth greater than the depth of one EAB, the decoders are not in use. But when EABs are combined to provide EABs with a depth greater than the depth of one EAB, each programmable decoder in a combined EAB chain is programmed to respond to address information contained in a subset of the data bits inputted to the EAB. Typically, when EABs are combined to form chains with depth greater than the maximum depth ("MD") of one EAB, each of the combined EABs will be in its MD×1 mode.

When data is written into an EAB chain with a depth greater than MD, each write decoder (already programmed to respond to an address contained in a subset of the higher order data bits) enables its respective EAB in the chain to perform a write operation when it reads its particular chain address from a subset of the data bit conductors. The EAB then writes one bit of data into RAM in a way that is already known in the prior art (see, for example, the '195 patent).

When data is read from an EAB chain with a depth greater than MD, each read decoder (already programmed to respond to address information contained in another subset of the higher order data bits) enables a tri-state driver to drive one bit of data read from its respective EAB onto one conductor of a subset of provided tri-state conductors. In this way, each EAB in the chain is effectively multiplexed to provide its one bit of data to a particular conductor in a subset of the tri-state conductors. The data bit may then be transmitted from the tri-state conductor to the normal global routing resources associated with the EAB.

To provide EABs with depths greater than MD and widths greater than one bit (i.e., a 4K×8 EAB where MD is 2K), multiple chains of EABs can be combined. In this embodiment, while each EAB in a chain uses the same tri-state conductor, each chain uses a different tri-state conductor. Thus, each EAB in a chain is multiplexed onto a particular conductor not currently used by another chain in order to provide multi-bit-wide chains of depths greater than MD. For example, each bit in the multi-bit-wide group may be applied to the normal global routing resources associated with the least significant bit of one of the EABs in the chain associated with that bit in the multi-bit group.

Further features of the invention, its nature and various advantages will be more apparent from the accompanying drawings and the following detailed description of the preferred embodiments.

BRIEF DESCRIPTION OF THE DRAWINGS

FIG. 4 is a table showing the connectivity between particular EABs and tri-state conductors in a particular embodiment of the invention.

DETAILED DESCRIPTION OF THE PREFERRED EMBODIMENTS

Figure 1:
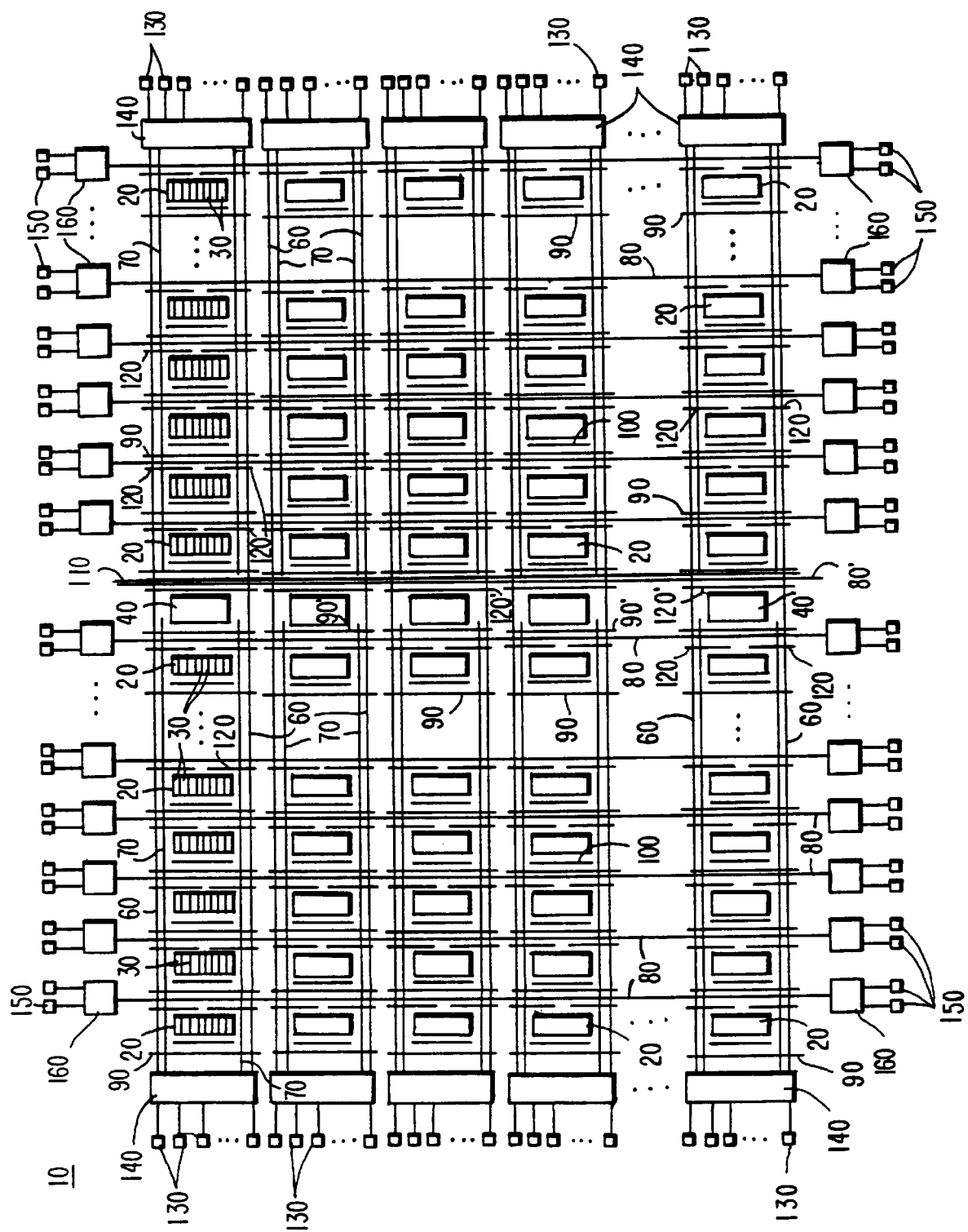
FIG. 1 is a simplified, partial, schematic block diagram of an illustrative programmable logic array device that can be constructed in accordance with the principles of this invention.

With reference to FIG. 1, illustrative programmable logic array integrated circuit device 10 has a plurality of regions 20 of programmable logic disposed on the device in a two-dimensional array of intersecting rows and columns. At the center of each row there is a region of RAM 40 (also known as an EAB) that is programmable and usable by the user to store and output any desired data. Much of the particular structure of such a programmable logic array integrated circuit device has already been explained in the prior art (e.g., the '195 patent) and therefore need not be explained again herein. However, FIG. 1 also shows the inclusion in device 10 of a plurality of tri-state vertical conductors 110 associated with the column of EABs 40 in accordance with the present invention. These conductors 110 will be explained in detail below.

Figure 2:
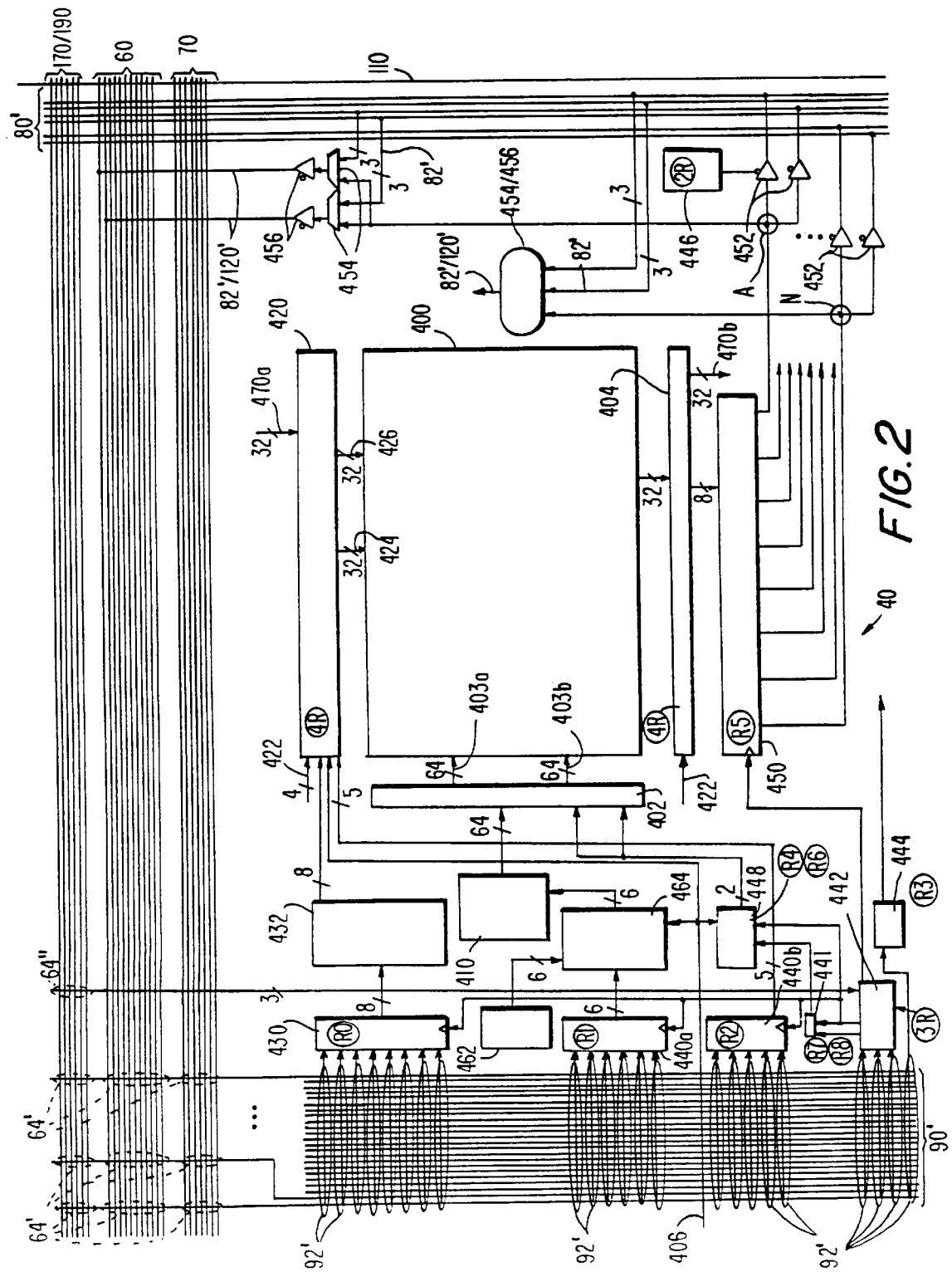
FIG. 2 is a more detailed, but still simplified, schematic block diagram of a representative portion of apparatus of the type shown in FIG. 1.

FIG. 2 shows a typical RAM or EAB region 40 in more detail, there being one such RAM region associated with each row in FIG. 1. Each RAM region 40 includes 2048 ("2K") bits of random access memory. These RAM bits are organized in a 64×32 array 400, which can be configured as a 256×8, 512×4, 1024×2, or 2048×1 memory. (See, for example, the '782 patent.) Array 400 can be used as a static random access memory (SRAM) or as a read-only memory (ROM). Each memory cell can be accessed through a row decoder 410 and a column decoder 420. RAM region 40 needs a maximum of 11 address signals, eight data signals, a read-write control signal, two clock signals, and an output enable signal in order to operate.

The interface of RAM region 40 to the remainder of the chip is known in the prior art (see the '782 and '195 patents). Furthermore, when memory of a depth greater than 2K is not needed, the operation of the programmable logic array device is the same as that described in the prior art (see the '782 and '195 patents). This prior art information therefore need not be repeated herein. However, FIG. 2 again shows the inclusion of tri-state vertical conductors 110 in accordance with this invention as will be explained in detail below.

Figure 3:
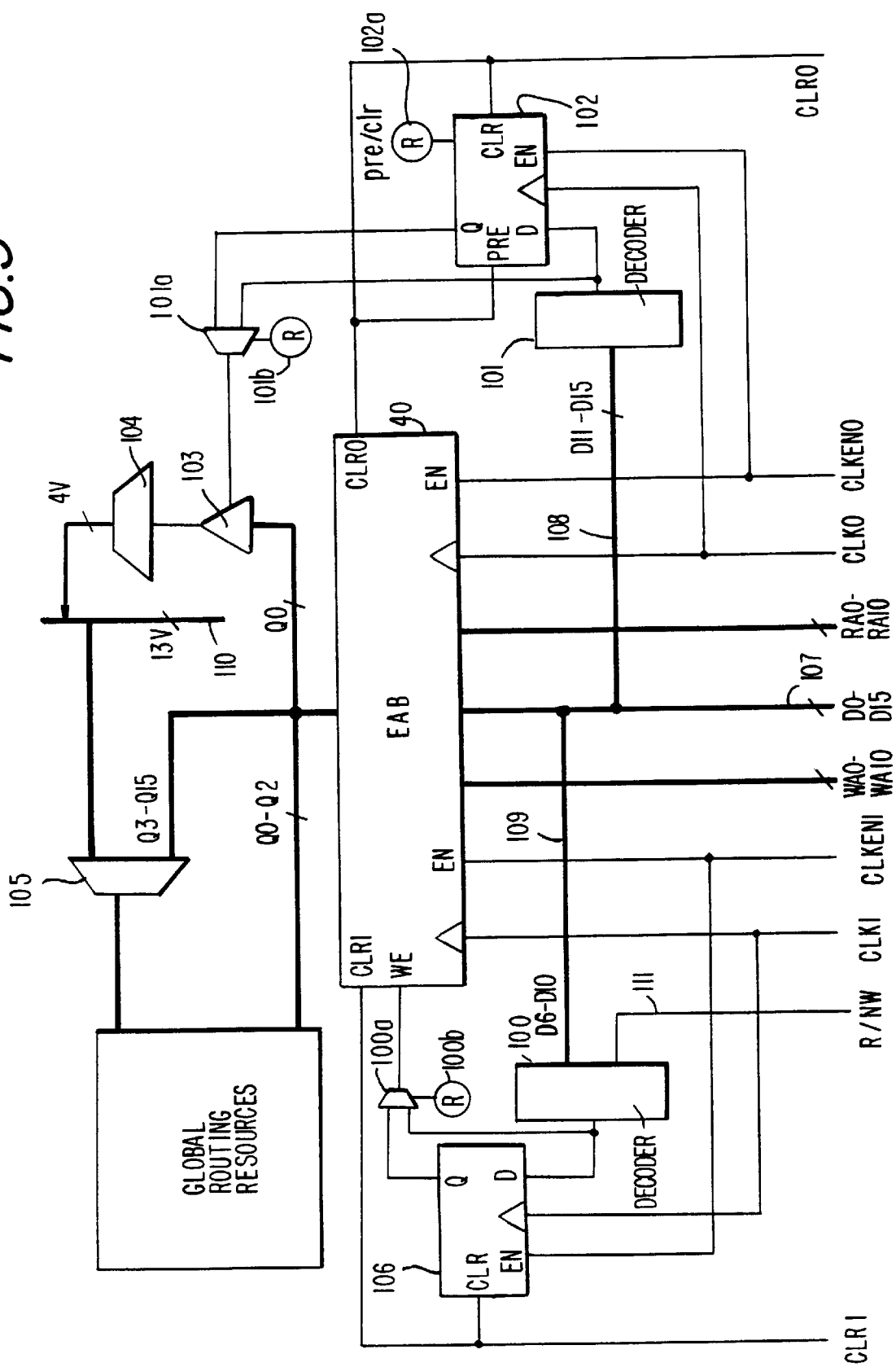
FIG. 3 is a another more detailed, but still simplified, schematic block diagram of a representative portion of apparatus of the type shown in FIG. 1.
Figure 5:
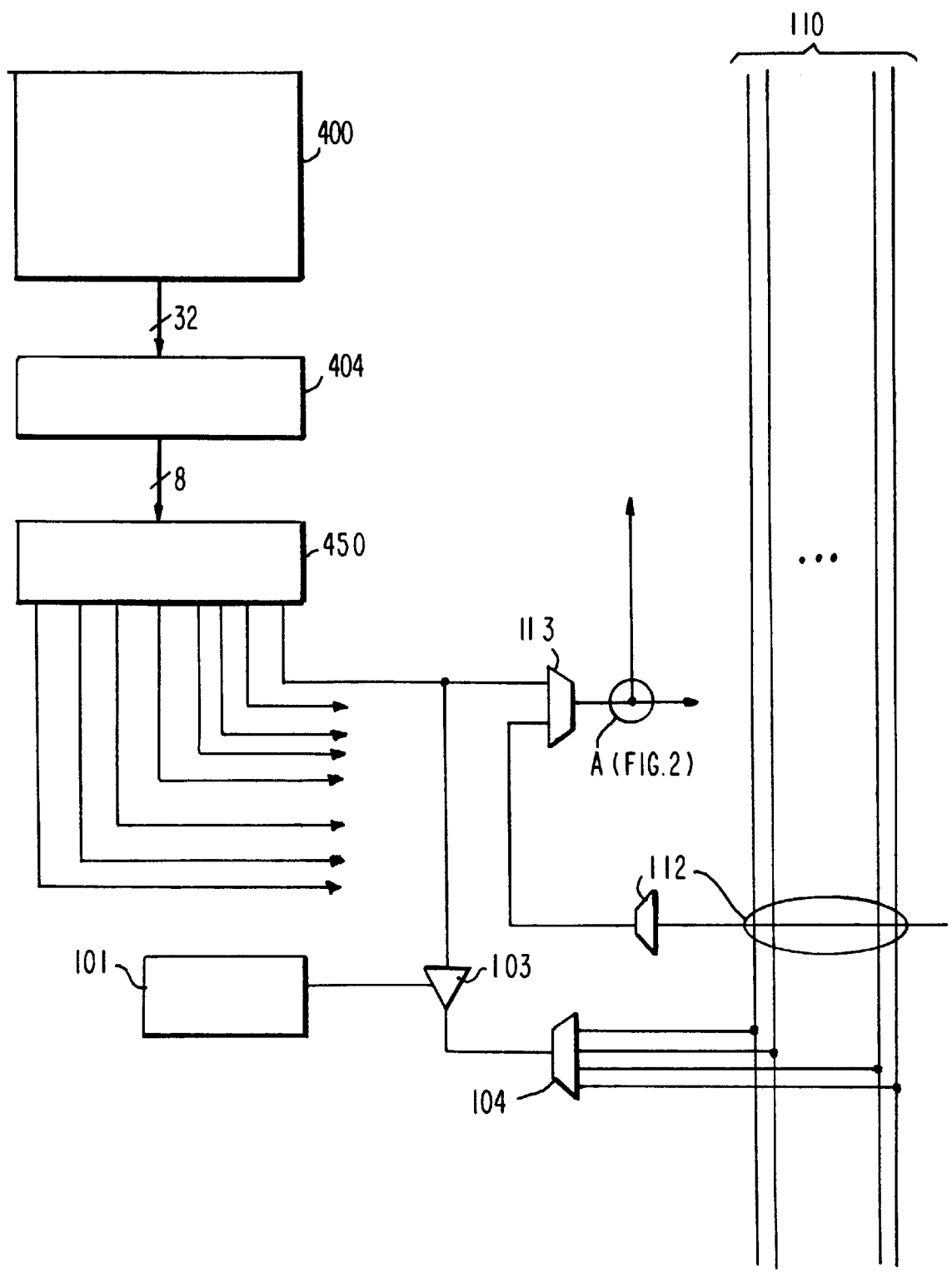
FIG. 5 is a more detailed, but still simplified, schematic block diagram of a representative portion of apparatus of the type shown in FIG. 1.

FIG. 3 shows more particularly an illustrative embodiment of structure in accordance with this invention for combining EABs 40 in order to provide EABs with a depth greater than 2K in accordance with this invention. (Whereas FIGS. 2 and 5 show embodiments of EABs 40 with eight parallel data inputs and eight parallel data outputs, FIG. 3 shows an embodiment with 16 parallel data inputs and 16 parallel data outputs. However, this slight variation will not interfere with understanding how circuits of the general types shown in these FIGS. relate to one another.)

When chains of a depth greater than 2K are needed, several EABs are associated or grouped in a chain, and each EAB in the chain is assigned unique write and read addresses. Write decoder 100 and read decoder 101 associated with each EAB in the chain are respectively programmed to respond to the chain write and chain read addresses of that EAB. During operation, the chain write and/or read addresses are provided on respective subsets of data conductors 107. (Data conductors 107 typically correspond to the eight inputs to element 430 (from programmable logic connectors ("PLCs") 92') in FIG. 2, although as has been mentioned the number of such conductors is greater in the FIG. 3 embodiment than in the FIG. 2 embodiment.) In the depicted preferred embodiment, the chain read address information for read decoder 101 is provided in a different subset of the data bits than that of the chain write address for write decoder 100. This feature, while not essential to practice the invention, allows the EAB to perform in a "dual port" mode, which makes possible simultaneous reading and writing of data in different parts of the EAB. Other structure shown in FIG. 3 includes conventional EAB input signals R/NW (read/not write), CLKI (clock for input registers), CLKENI (clock enable for input registers), CLKO (clock for output registers), CLKENO (clock enable for output registers), CLRI (clear for input registers), and CLRO (clear for output registers). As is conventional, EAB 40 can be programmably configured to independently register most of its inputs and outputs (i.e., WA0–WA10, D0–D15, RA0–RA10, and Q0–Q15). The CLKI, CLKENI, CLRI, CLKO, CLKENO, and CLRO signals are used for conventional control of these input and output registers.

When the "read/not write" signal on conductor 111 is logic 0 (and assuming that the depicted EAB has been chained with other EABs to provide an aggregate EAB having depth greater than 2K), write decoder 100 responds to chain write address information received via conductors 109, which carry a subset of the high-order bits of the data signals 107. Thus the R/NW signal continues to be required as a master signal for conditioning decoder 100 to produce the write enable signal WE for the associated EAB. Because chained EABs typically operate in their 2K×1 mode, only one data bit is needed for actual data. This frees the remaining data bit lines 107 for carrying chain address information. (Other modes (e.g., 1K×2 mode) can be provided if it may be desired to create EABs with depths that are not a power of 2K.) Write decoder 100 examines the chain write address information transmitted on conductors 109. If the address is the chain address programmed into write decoder 100, the write decoder transmits a write enable signal WE to EAB 40, either directly via PLC 100a or somewhat less directly via flip-flop 106 and then PLC 100a. (PLC 100a is controlled by programmable function control element ("FCE") 100b (e.g., a programmable memory cell) to select either the unregistered or registered versions of the output signal of decoder 100 for use as the WE signal. The unregistered version is typically used when the WA0–WA10 signals are unregistered. The registered version from flip-flop 106 is typically used when the WA0–WA10 signals are registered.) EAB 40 writes the data on lead D0 into the EAB memory location specified by conventional address signals WA0–WA10. Because each chain write address is unique within each chain, only one EAB in the chain reads the data into its RAM.

During a read (again assuming chaining of several EABs 40 together), each read decoder 101 in the chain of EABs responds to its chain read address, which is provided on another subset 108 of the high-order data bit conductors. When a read decoder 101 chain address matches that on conductors 108, it enables a tri-state driver 103 associated with that EAB, either directly via PLC 101a or somewhat less directly via flip-flop 102 and then PLC 101a. (PLC 101a is controlled by FCE 101b to select either the unregistered or registered versions of the output signal of decoder 101 for use in enabling tri-state driver 103. The unregistered version is typically used when the RA0–RA10 signals are unregistered. The registered version from flip-flop 102 is typically used when the RA0–RA10 signals are registered.) The data output of the EAB (from an EAB memory location selected by conventional read address signals RA0–RA10) is thereby transmitted to one (or more) of a subgroup of tri-state conductors 110 via tri-state driver 103 and PLC 104. (PLC 104 (e.g., a demultiplexer) is programmed to select the proper tri-state conductor 110.) Each EAB in a chain drives the same tri-state conductor 110 (selected by the PLCs 104 of the EABs in the chain). Because each read decoder 101 activates the associated tri-state driver 103 only when the proper chain read address is provided on conductors 108, each EAB in the chain is effectively multiplexed onto the same conductor 110. In a typical application, there might be a total of 32 tri-state conductors 110 per EAB column, with each EAB capable of driving any one or more of several of these 32 conductors. (FIG. 3 shows 13 tri-state conductors 110, with each EAB capable of driving any one or more of four of them.) Finally, the data output on the selected tri-state conductor 110 is applied to the conventional global routing resources in a way that will be further described below.

Note that flip-flop 102 is programmable by FCE 102a to respond to the CLRO signal as either a preset or clear signal for the flip-flop. This feature is provided because exactly one EAB 40 in each chain of EABs must drive out onto the tri-state bus at any one time (i.e., the tri-state bus should never be left floating). When EAB 40 is configured to register its address lines RA0–RA10, the output of decoder 101 must also be registered so that the enabling and disabling of tri-state driver 103 happens on the same clock edge as the changing EAB address. The same clock and clear signals that feed the read address registers contained in EAB 40 feed register 102. Now, when the read address registers for a stitched EAB are cleared, they clear every EAB in the chain of EABs. However, one EAB (e.g., the EAB whose decoder 101 decodes the chain read address which is all zeros) should drive out onto the tri-state bus 110 (because the tri-state bus should never be allowed to float). Thus, for this particular EAB in the chain, register 102 should be preset rather than cleared so that its tri-state driver 103 will be enabled.

By associating each EAB 40 with different subsets of tri-state conductors 110, chains of EABs can be combined to form multi-bit-wide EABs deeper than 2K (e.g., a 4K×8 EAB). This is done by connecting each "bit" (EAB chain which is deeper than 2K) in the "word" (a number of chains in parallel) to a different tri-state conductor 110. Preferably, however, each EAB 40 is connectable only to a sub-set of tri-state conductors 110 (e.g., three or four). Thus, a tri-state conductor pattern for output bit 0 of each EAB must be determined for the number of EABs in the device. (It will be appreciated how this principle can be extended to other outputs of the EABs if the EABs are going to be used in modes other than 2K×1 when combined.)

FIG. 4 shows an illustrative pattern by which tri-state conductors 110 are associated with each EAB 40 in a 26-EAB device. (Note that the number of chain address bits needed in this embodiment is five.) Each EAB 40 can connect to up to four tri-state conductors 110 (identified as V0–V12 in FIG. 4). PLC 104 connectivity is indicated by the asterisks in FIG. 4. For example, EAB0 can connect to tri-state conductors V0, V2, V3, and V4 via a PLC 104. The same is true for EAB1 and EAB2.

If a 52K×1 chain is desired, all 26 EABs 40 can be multiplexed onto V0. Or, if a 26K×1 chain is desired, there would be two ways to make it: one chain using EAB0–EAB12 and multiplexing their outputs onto V2; the other using EAB13–EAB25, multiplexing their outputs onto V1. In this way, two separate chains can be provided and accessed simultaneously if desired.

In another application, a 26K×2 memory may be desired. This can be done by using a 26K×1 chain made up of EAB0–EAB12 multiplexed onto tri-state conductor V2, and by using another 26K×1 chain made up of EAB13–EAB25 multiplexed onto tri-state conductor V1. One chain corresponds to the first data bit, and the other chain the second. The two bits (of one two-bit word) on the two chains can be read (or written) in parallel. This is done by programming two EABs which correspond to the same word to enable their outputs when one chain address is provided. For example, read decoders 101 in EAB0 and EAB13 are programmed to enable their outputs in response to the same chain address.

FIG. 5 shows a typical way in which to use the normal global routing resources of the programmable logic array device for EAB outputs when combining EABs to form chains deeper than 2K. As mentioned above, PLC 104 is programmed to provide the output of EAB 40 to the appropriate tri-state conductor 110, according to the tri-state conductor pattern. (Bit 0 of RAM output register 450 is directed through PLC 104 accordingly.) Each RAM output register 450 bit 0 is also connected to PLC 113. PLC 113 is programmed to select either the normal mode output or the chained mode output (from the appropriate tri-state conductor 110 selected by PLC 112) and to apply the selected signal to existing routing resources (as shown downstream from point A in FIG. 2).

The upper part of FIG. 3 shows an alternative and somewhat more general embodiment of circuitry for allowing tri-state conductors 110 to use the normal global routing resources of the EABS. In this embodiment PLC 105 is programmable to select 13 outputs to the conventional global routing resources (again as shown downstream from points A–N in FIG. 2) from (1) EAB outputs Q3—Q15 and (2) the 13 tri-state conductors 110. EAB outputs Q0–Q2 are also always available to the conventional global routing resources.

Figure 6:
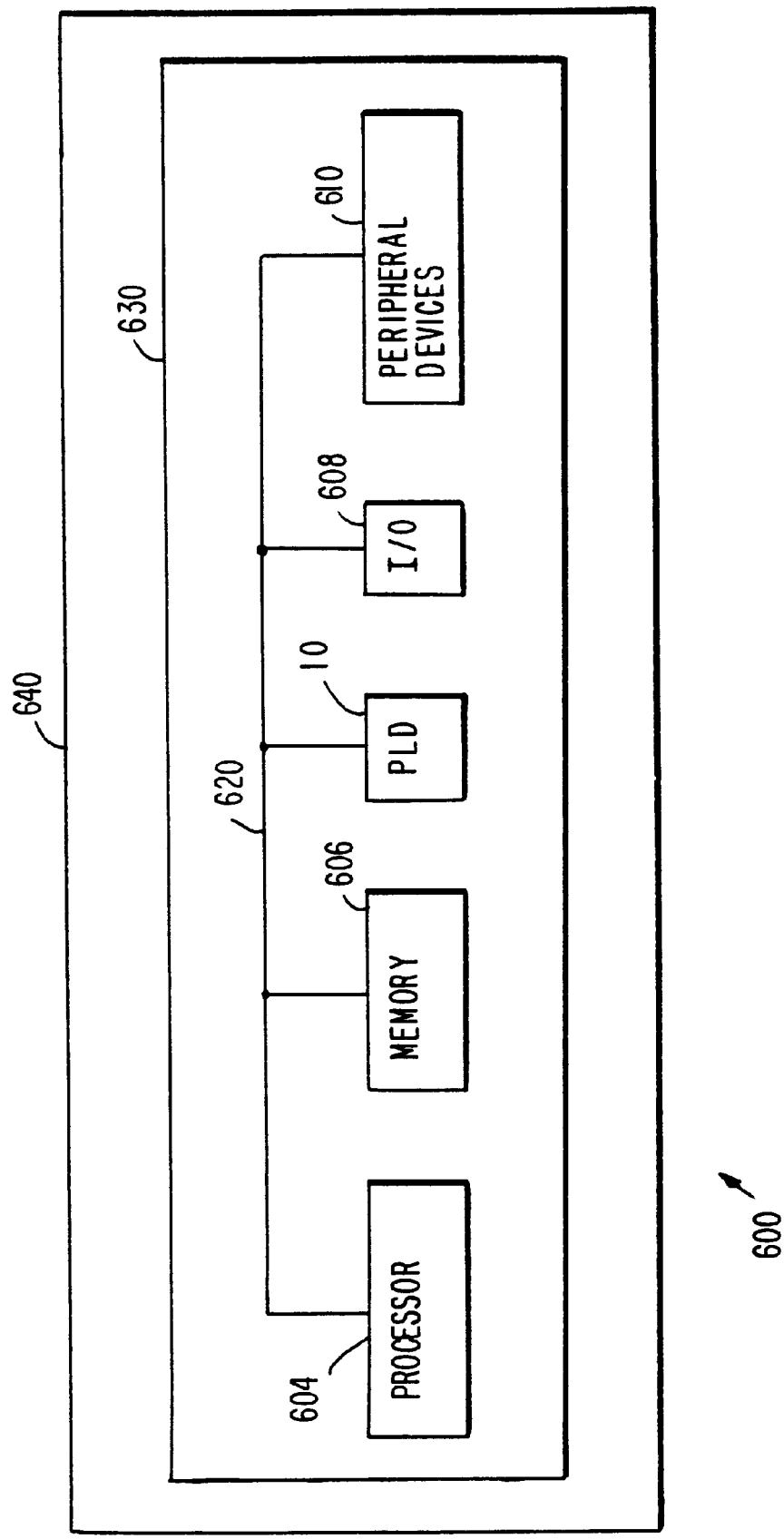
FIG. 6 is a simplified block diagram of an illustrative system employing a programmable logic device with EAB-related circuitry in accordance with the invention.

FIG. 6 illustrates a programmable logic device 10 (which includes EAB-related circuitry in accordance with this invention) in a data processing system 600. In addition to device 10, data processing system 600 may include one or more of the following components: a processor 604; memory 606; I/O circuitry 608; and peripheral devices 610. These components are coupled together by a system bus 620 and are populated on a printed circuit board 630 which is contained in an end-user system 640.

System 600 can be used in a wide variety of applications, such as computer networking, data networking, instrumentation, video processing, digital signal processing, or any other application where the advantage of using reprogrammable logic is desirable. Programmable logic device 10 can be used to perform a variety of different logic functions. For example, programmable logic device 10 can be configured as a processor or controller that works in cooperation with processor 604. Programmable logic device 10 may also be used as an arbiter for arbitrating access to a shared resource in system 600. In yet another example, programmable logic device 10 can be configured as an interface between processor 604 and one of the other components in system 600. It should be noted that system 600 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) FCEs can also be used to control or implement other components such as EABs. Like PLCs, FCEs can be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

It will be understood that the foregoing is only illustrative of the principles of the invention, and that various modifications can be made by those skilled in the art without departing from the scope and spirit of the invention. For example, the number of each type of conductor provided, the size and number of the EABs, etc., can all be changed as desired.

The invention claimed is:

1. A programmable logic integrated circuit device comprising:
    a plurality of regions of memory circuitry, each of which includes a plurality of memory locations addressable by address signals and configured to respectively store a plurality of data signals applied to that region via a plurality of data input conductors, each region being additionally configured to output data signals from its memory locations that are addressed by the address signals applied to that region;
    a plurality of programmable decoders, each decoder being associated with a respective one of the regions, and each decoder being configured to receive the signals on a multiplicity of the data input conductors of the associated region and being programmable to produce a predetermined decoder output signal in response to a particular logical combination of the signals received from the multiplicity of the data input conductors of the associated region;
    an inter-region conductor; and
    a plurality of output connectors, each output connector being associated with a respective one of the regions, and each output connector being configured to apply a data signal output by the associated region to the inter-region conductor in response to the predetermined decoder output signal from the decoder associated with that region.

2. The device defined in claim 1 wherein each output connector comprises a tri-state driver which is enabled by the predetermined decoder output signal.

3. The device defined in claim 1 wherein each of the decoders comprises:
    programmable componentry configured to programmably selectively produce the decoder output either substantially immediately in response to receipt by the decoder of the particular logical combination or only after additional receipt by the decoder of a synchronizing timing signal.

4. The device defined in claim 3 wherein the componentry comprises:
    a register configured to register and output the decoder output signal in response to receipt by the decoder of the synchronizing timing signal.

5. The device defined in claim 4 wherein the componentry comprises:
    programmable function control circuitry configured to cause the register to programmably selectively respond to a clear signal by either clearing or presetting the register.

6. The device defined in claim 1 further comprising:
    a plurality of programmable connectors, each programmable connector being associated with a respective one of the regions, and each programmable connector being programmable to selectively complete a circuit between the associated region and the inter-region conductor via the output connector associated with that region.

7. The device defined in claim 1 wherein the inter-region conductor is one of a plurality of inter-region conductors, and wherein the device further comprises:
    a plurality of programmable connectors, each programmable connector being associated with a respective one of the regions and being configured to selectively connect a data signal output by the output connector associated with the associated region to any of several of the inter-region conductors.

8. The device defined in claim 7 wherein the inter-region conductors, to which the programmable connector associated with each of the regions is configured to selectively connect a data signal output by the output connector associated with that region, include only a sub-plurality of the inter-region conductors.

9. The device defined in claim 8 wherein the subplurality of inter-region conductors, to which the programmable connectors associated with each of the regions can apply a data signal, includes at least one inter-region conductor that is included in a corresponding subplurality for at least one other region and at least a further different inter-region conductor that is not included in a corresponding subplurality for at least a further different region.

10. The device defined in claim 1 wherein each region must first receive a write enable signal in order to store data signals from the data input conductors, and wherein the device further comprises:
    a plurality of programmable write decoders, each write decoder being associated with a respective one of the regions, and each write decoder being configured to receive the signals on a severality of the data input conductors of the associated region and being programmable to produce a write enable signal applied to the associated region in response to a specific logical combination of the signals received from the severality of the data input conductors of the associated region.

11. The device defined in claim 10 wherein each of the write decoders is additionally configured to receive a master write enable signal and to produce the write enable signal applied to the associated region only if said master write enable signal is also received.

12. The device defined in claim 10 wherein each of the write decoders comprises:

programmable componentry configured to programmably selectively produce the write enable signal either substantially immediately in response to receipt by the write decoder of the specific logical combination or only after additional receipt by the write decoder of a synchronizing timing signal.

13. The device defined in claim 12 wherein the componentry comprises:

a register configured to register and output the write enable signal in response to receipt by the write decoder of the synchronizing timing signal.

14. The device defined in claim 1 further comprising:

a plurality of signal routing resource circuitries, each signal routing resource circuitry being associated with a respective one of the regions and being programmable to route data signals output by the associated region to other parts of the device; and a plurality of programmable connectors, each programmable connector being associated with a respective one of the regions and being programmable to apply either a data signal output by the associated region or a signal from the inter-region conductor to the signal routing resource circuitry associated with that region.

15. A digital processing system comprising:

processing circuitry;

a memory coupled to said processing circuitry; and a programmable logic integrated circuit device as defined in claim 1 and coupled to the processing circuitry and the memory.

16. A printed circuit board on which is mounted a programmable logic integrated circuit device as defined in claim 1.

17. The printed circuit board defined in claim 16 further comprising:

a memory mounted on the printed circuit board and coupled to the programmable logic integrated circuit device.

18. The printed circuit board defined in claim 16 further comprising:

processing circuitry mounted on the printed circuit board and coupled to the programmable logic integrated circuit device.

* * * * *